United States Patent
Narayanan et al.

(10) Patent No.: US 7,402,448 B2
(45) Date of Patent: Jul. 22, 2008

(54) PHOTOVOLTAIC CELL AND PRODUCTION THEREOF

(75) Inventors: Srinivasamohan Narayanan, Gaithersburg, MD (US); Bikash Kumar, Bangalore (IN)

(73) Assignee: BP Corporation North America Inc., Warrenville, IL (US)

( * ) Notice: Subject to any disclaimer, the term of this patent is extended or adjusted under 35 U.S.C. 154(b) by 61 days.

(21) Appl. No.: 10/767,625

(22) Filed: Jan. 28, 2004

(65) Prior Publication Data

US 2004/0259335 A1 Dec. 23, 2004

(51) Int. Cl.
 *H01L 21/00* (2006.01)
(52) U.S. Cl. .......................................... 438/48; 257/431
(58) Field of Classification Search ................. 136/246; 257/431; 438/48
See application file for complete search history.

(56) References Cited

U.S. PATENT DOCUMENTS

| | | | |
|---|---|---|---|
| 4,135,950 A * | 1/1979 | Rittner ........................ | 136/255 |
| 4,251,285 A | 2/1981 | Yoldas et al. | |
| 4,610,077 A * | 9/1986 | Minahan et al. .............. | 438/68 |
| 5,091,018 A * | 2/1992 | Fraas et al. ................. | 136/246 |
| 5,665,175 A | 9/1997 | Safir | |
| 6,340,640 B1 | 1/2002 | Nishimoto et al. | |
| 6,380,479 B2 * | 4/2002 | Nakai et al. .................. | 136/246 |
| 6,541,695 B1 * | 4/2003 | Mowles ........................ | 136/252 |

FOREIGN PATENT DOCUMENTS

| | | |
|---|---|---|
| EP | 0537781 A1 | 4/1993 |
| EP | 0 680 099 A2 | 11/1995 |
| JP | 58101471 A | 6/1983 |
| JP | 02033980 A | 2/1990 |
| JP | 03024768 A | 4/1991 |
| WO | 9119323 A | 12/1991 |
| WO | 01/82383 | 11/2001 |
| WO | 02/103810 A1 | 12/2002 |

OTHER PUBLICATIONS

Crystalline Silicon Solar Cells—Chapter 4,, Martin A. Green—Photovoltaics Special Research Centre, University of New South Wales, Sydney, N.S.W. Australia, 2052.

* cited by examiner

*Primary Examiner*—Douglas M Menz
(74) *Attorney, Agent, or Firm*—Thomas E. Nemo

(57) ABSTRACT

An efficient photovoltaic cell, and its process of manufacture, is disclosed wherein the back surface p-n junction is removed from a doped substrate having an oppositely doped emitter layer. A front surface and edges and optionally the back surface periphery are masked and a back surface etch is performed. The mask is not removed and acts as an anti-reflective coating, a passivating agent, or both. The photovoltaic cell retains an untextured back surface whether or not the front is textured and the dopant layer on the back surface is removed to enhance the cell efficiency. Optionally, a back surface field is formed.

7 Claims, 1 Drawing Sheet

PHOTOVOLTAIC CELL AND PRODUCTION THEREOF

This invention was made with Government support under NREL Subcontract # ZAX-8-17647-05; Prime Contract # DE-AC36-83CH10093 awarded by the Department of Energy. The Government has certain rights in this invention.

BACKGROUND OF THE INVENTION

This invention relates to photovoltaic devices, particularly photovoltaic devices comprising thin layers of semiconductor materials, such as thin layers of monocrystalline or multicrystalline silicon. More particularly, this invention relates to photovoltaic devices comprising monocrystalline or multicrystalline silicon semiconductor materials. These devices which comprise doped wafers of monocrystalline or multicrystalline silicon convert light energy into electrical energy.

These photovoltaic devices, also known as photovoltaic cells, are used to convert light energy into electrical energy. Photovoltaic cells can be used to generate energy (solar cells) or they can be used as photodector elements in other devices. Photovoltaic cells are a source of renewable energy. However their use is limited by their electrical output. Typically, many photovoltaic cells are arranged in one or more panels or modules in order to generate sufficient power required for a desired commercial or consumer application. Photovoltaic cells having greater efficiency result in modules with greater electrical power output. Therefore, it is necessary to be able produce a large number of highly efficient photovoltaic cells. It would be very desirable to be able to reduce the manufacturing cost, increase the efficiency of light conversion, or both, of such photovoltaic devices. The photovoltaic cells of this invention are highly efficient in comparison to conventionally produced cells and the process of this invention allows these highly efficient cells to be produced more easily than conventionally produced photovoltaic cells.

Most photovoltaic cells are fabricated from either monocrystalline silicon or multicrystalline silicon. Silicon is generally used because it is readily available at a reasonable cost due to its use in the microelectronics industry and because it has the proper balance of electrical, physical and chemical properties for use to fabricate photovoltaic cells. During the manufacture of photovoltaic cells, silicon is doped with a dopant of either positive or negative conductivity type, and is typically cut into thin substrates, usually in the form of wafers or ribbons, by various methods known in the art. Throughout this application, the surface of the substrate, such as a wafer, intended to face incident light is designated as the front surface and the surface opposite the front surface is referred to as the back surface. By convention, positive conductivity type is commonly designated as "p" and negative conductivity type is designated as "n." In this application, "p" and "n" are used only to indicate opposing conductivity types. In this application, "p" and "n" mean positive and negative respectively but can also mean negative and positive respectively. The key to the operation of a photovoltaic cell is the creation of a p-n junction, usually formed by further doping the front surface of the silicon substrate to form a layer of opposite conductivity type from the doped silicon substrate. Such a layer is commonly referred to as the emitter layer. In the case of a p-doped substrate, the emitter layer would be formed by doping the front surface with an n-type dopant. The p-n junction is the interface between the p-doped region and the n-doped region. The p-n junction allows the migration of electron-hole pairs in response to incident photons which causes a potential difference across the front and back surfaces of a substrate wafer.

Fabrication of a photovoltaic cell generally begins with a p-doped substrate. The substrate, typically in the form of a wafer, is then exposed to an n-dopant to form an emitter layer and a p-n junction. Typically, the n-doped layer is formed by first depositing an n-dopant onto the surface of the substrate using techniques commonly employed in the art, such as spray on, spin on, chemical vapor deposition, or other deposition methods. After deposition of the n-dopant upon the substrate surface, the n-dopant is driven into the surface of the silicon substrate to further diffuse the n-dopant into the substrate surface. This "drive-in" step is commonly accomplished by exposing the wafer to heat, often in combination with a gas stream comprising oxygen, nitrogen, steam, or a combination thereof. The n-doped layer is commonly referred to as an emitter layer.

A p-n junction is formed at the boundary region between the n-doped layer and the p-doped silicon substrate. The p-n junction is required to allow the charge carriers to migrate in response to incident light. Ideally, the emitter layer would be limited to the surface of the wafer designed to be oriented towards incident light, which is referred to as the front surface, and, consequently, the p-n junction would be proximal to the front surface only. In practice, however, doping will also occur on the edges and the opposing surface of the wafer (the back surface). This results in an emitter layer which covers the entire surface of the wafer and a p-n junction proximal to the entire surface of the wafer from which an electric current cannot be drawn. It is therefore necessary to electrically isolate the front and back junctions. The wafer can be masked so that an emitter layer forms only on selected surfaces of the wafer. However, such masking requires additional time, materials, and handling, particularly if it must be removed later. It would be advantageous if such a masking step could be eliminated or combined with another process step.

U.S. Pat. No. 5,082,791 to Micheels et al. discloses the use of an excimer laser to isolate the front p-n junction. Micheels et al. use an excimer laser to form a trench on the back surface of the substrate. The trench is deeper than the n-doped layer and extends along the entire periphery of the back surface at a fixed distance from the edges of the back surface.

U.S. Pat. No. 4,158,591 to Avery et al., which is incorporated by reference herein, discloses a method to electrically isolate the front p-n junction by removing the p-n junction from the edges of the substrate without removing the front and rear p-n junctions. Isolation of the front p-n junction by removing the edge p-n junction is commonly referred to as "edge junction isolation." The edge junction isolation method disclosed by Avery et al. has come to be known as "coin stacking." In the coin stacking process, the photovoltaic cells are stacked face to face and the edges are removed. The edges can be removed by plasma etching, by wet chemical etching, by physical grinding or other known methods. U.S. Pat. No. 5,871,591 to Ruby et al., incorporated by reference herein, describes a process commonly used to fabricate photovoltaic cells. The process described by Ruby et al. includes an edge junction isolation step accomplished by the coin stacking process.

Use of the coin stacking method results in lower cost and higher production rate when compared to previous methods for isolating the front p-n junction but also has several disadvantages. The physical stacking of the wafers can cause some wafers to be damaged. It is advantageous to minimize the thickness of the silicon substrate because the silicon substrate is a significant portion of the cost and size of a photovoltaic cell. Unfortunately, the coin stacking method significantly limits the thinness of the wafers. The fraction of wafers that are damaged during coin stacking increases as the wafer thickness decreases. As a result, coin stacking limits the cost savings achievable through use of thinner wafers. Another disadvantage of the coin stacking method is that it decreases the area of the front surface of a photovoltaic cell. Ideally, removal of the edge junction would result only in the removal of the n-doped region. In practice, however, some additional depth is also removed from the edge. Typically, the useful surface area of the front surface is decreased by about 2 percent, resulting in a corresponding 2 percent decrease in the energy output of the photovoltaic cell.

Efficiency of a photovoltaic cell is determined by the capacity of the cell to convert incident light energy into electrical energy. Several modifications to the design and production of photovoltaic cells have been developed to increase conversion efficiency. Chapter 4 of *Crystalline Silicon Solar Cells*, by Martin A. Green, Photovoltaics Special Research Centre, University of New South Wales, which is incorporated by reference herein, discusses photovoltaic cell developments that increase cell efficiency including the use of texturing, antireflective coatings, surface passivation, and back surface fields.

Texturing of a photovoltaic cell reduces reflection of incident light by the photovoltaic cell surface. By reducing reflection, more incident light is available for conversion by the photovoltaic cell. Texturing is typically accomplished by chemical etching and in particular by anisotropic etching of the silicon substrate. Antireflective coatings further reduce the reflection of incident light at the photovoltaic cell surface. Antireflective coatings are typically applied by forming an oxide or silicon nitride layer on the wafer.

Surface passivation increases efficiency of a photovoltaic cell by decreasing electronic activity at the surface of the photovoltaic cell. Several methods of surface passivation are known in the art, including the use of oxide or silicon nitride coatings.

Back surface fields increase the efficiency of photovoltaic cells. Back surface fields are particularly desirable for photovoltaic cells with thin substrates. Photovoltaic cells with thin substrates have many benefits, including reduced material requirements, lower cost and less weight, but also exhibit a decrease in efficiency, generally attributed to an increase in the diffusion of minority charge carriers to the back surface of the cell. Back surface fields decrease such diffusion of minority carriers and increase the current generated by majority carriers. U.S. Pat. No. 5,899,704 to Schlosser et al., incorporated by reference herein, discloses a method of creating a back surface field. Generally, a back surface field is created by incorporating a thin layer at the back surface which is heavily doped with a dopant of opposite conductivity type from the emitter layer.

There is a need for a photovoltaic cell with high efficiency and preferably one that can be fabricated at low cost. More particularly, there is a need for a photovoltaic cell manufacturing process that isolates the front p-n junction of a silicon or other semiconductor substrate without the increased cell damage of the coin stacking method. There is also a need for a photovoltaic cell manufacturing process that allows for the use of less silicon through thinner wafers. The process of this invention provides such a photovoltaic cell and process.

SUMMARY OF THE INVENTION

This invention is a photovoltaic device or cell comprising a substrate, suitably in the form of a wafer, comprising silicon doped with a first dopant, and having a front surface, an untextured or substantially smooth back surface, at least one edge surface, a first layer on the front surface and the at least one edge surface comprising a second dopant of a conductivity type opposite to the first dopant, and having a surface coating disposed over the front surface. Preferably, the surface coating is also disposed over the at least one edge surface and, preferably, the periphery of the back surface. This invention is also a photovoltaic device comprising a substrate, suitably in the form of a wafer, comprising doped silicon, having a back surface substantially free of a p-n junction and having a p-n junction proximal to a front surface and at least one edge surface and having a surface coating disposed over the front surface. Preferably, the surface coating is also disposed over the at least one edge surface and, preferably, the periphery of the back surface. The surface coating preferably comprises silicon nitride. The front surface of the photovoltaic devices can optionally be textured. Preferably, the back surface is free or substantially free of the second dopant. Optionally, the photovoltaic devices further comprise a back surface field. The photovoltaic cells of this invention are useful for converting light energy, e.g. solar energy, into electrical energy. The photovoltaic cells of this invention are also useful as sensor or detector elements in light sensitive devices. The photovoltaic cells of this invention are highly efficient and are produced more easily than other commercially produced photovoltaic cells.

This invention is also a photovoltaic module comprising the photovoltaic devices or cells of this invention.

This invention is also a process for making a photovoltaic device or cell using a substrate, suitably in the form of a wafer, comprising silicon and doped with a first dopant, the process comprising the steps of forming a first layer on the substrate, the first layer comprising a second dopant of a conductivity type opposite the first dopant; forming a surface coating disposed over the substrate, preferably such that a back surface of the substrate is free or substantially free of the surface coating, and removing the second dopant from the back surface such that the back surface is free or substantially free of the second dopant. Preferably, the surface coating comprises silicon nitride. Preferably, the process further comprises the step of forming a back surface field. The step of removing the second dopant from the back surface such that the back surface is free or substantially free of the first dopant preferably comprises chemically etching the substrate. Optionally, the substrate can be textured and the texture can be advantageously removed from the back surface such that the back surface is untextured or substantially smooth, preferably by chemical etching.

This invention is also a process for making a photovoltaic device or cell using a substrate, suitably in the form of a wafer, comprising silicon and doped with a first dopant, the process comprising forming a p-n junction proximal to the entire surface of the substrate, forming a surface coating disposed over the substrate such that a back surface remains free or substantially free of the surface coating, and removing the p-n junction from the back surface such that the back surface is free or substantially free of the p-n junction. Preferably, the surface coating comprises silicon nitride. Preferably, the process further comprises the step of forming a back surface field. The step of removing the p-n junction from the back surface such that the back surface is free or substantially free of the p-n junction preferably comprises chemically etching the substrate. Optionally, the substrate can be textured and the texture can be advantageously removed from the back surface such that the back surface is untextured or substantially smooth, preferably by chemical etching.

The processes of this invention overcome limitations in the prior art processes for making photovoltaic cells and simplify the production of highly efficient photovoltaic cells.

DESCRIPTION OF THE PREFERRED EMBODIMENT(S)

Figure 1:
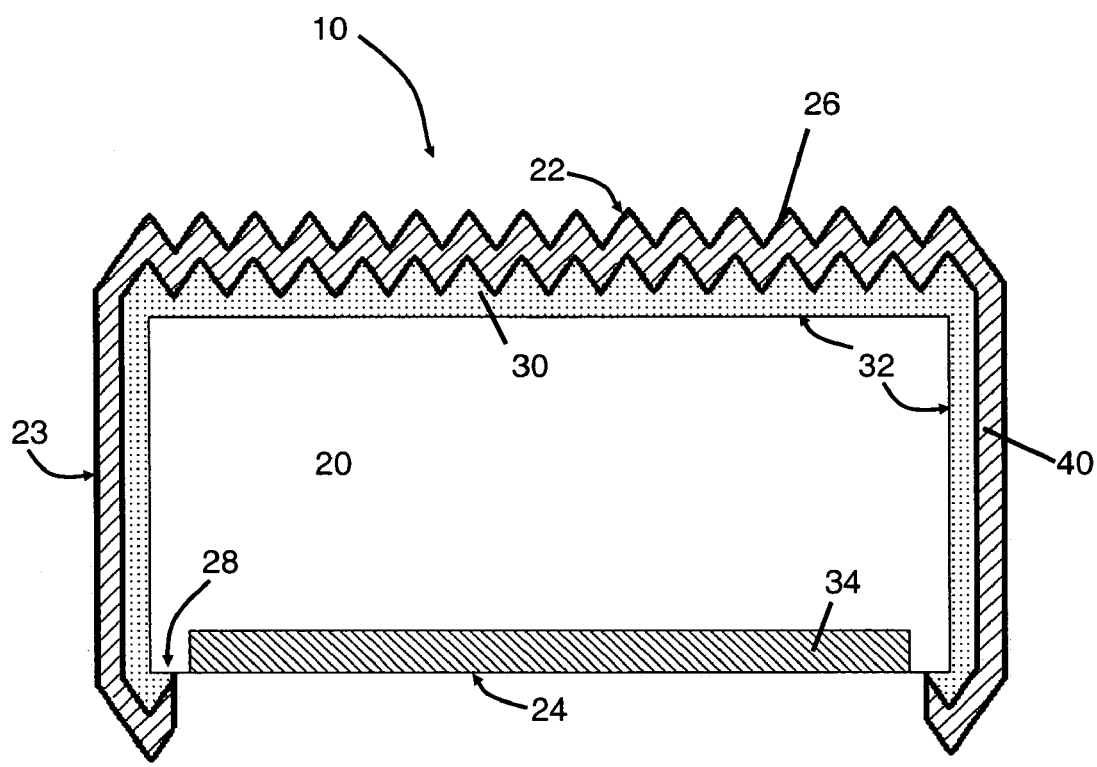
FIG. 1 shows a schematic cross-section view of an embodiment of a photovoltaic cell of this invention made in accordance with the process of this invention.

In one embodiment of this invention, a photovoltaic cell is fabricated using a boron doped substrate comprising silicon, typically in the form of a wafer or a ribbon. The substrate can comprise monocrystalline silicon and the substrate can comprise multicrystalline silicon. As used herein, "silicon" includes monocrystalline silicon and multicrystalline silicon unless expressly noted. One or more layers of additional material; for example, germanium, may be disposed over the substrate surface or incorporated into the substrate if desired. As used herein, "disposed over" is not restricted to a layer being directly over and in contact with the object or area it is disposed over. Other intervening materials or layers may be present. Although boron is widely used as the p-type dopant, other p-type dopants, for example, gallium or indium, will also suffice.

Wafers are typically obtained by slicing silicon ingots, vapor phase deposition, liquid phase epitaxy or other known methods. Slicing can be via inner-diameter blade, continuous wire or other known sawing methods. Although the substrate can be cut into any generally flat shape, wafers are typically circular or pseudo-square in shape. By "pseudo-square," is meant a predominantly square shape, usually with rounded corners. Substrates, typically in the form of a wafer, of this invention are typically less than about 400 micrometers thick. Substrates of this invention can be less than about 200 micrometers thick, preferably less than 150 micrometers thick, more preferably less than 100 micrometers thick, and most preferably less than 50 micrometers thick. Typically, they are at least about 10 micrometers, more preferably 20 micrometers thick. Circular and pseudo-square substrates are typically cut from a cylindrical silicon block having a diameter in the range of 100 mm to 200 mm. In comparison, substrates used in the coin-stacking process experience significant damage if less than about 200 micrometers thick and are effectively limited to being greater than 200 micrometers thick.

The substrate is typically cleaned to remove any surface debris and cutting damage. Typically, this includes placing the substrate in a wet chemical bath; for example, a solution comprising any one of a base and peroxide mixture, an acid and peroxide mixture, a NaOH solution, or several other solutions known and used in the art. The temperature and time required depends on the specific solution used, for example, a 25 wt % to 35 wt % aqueous NaOH solution can be used at a temperature in the range of about 75 to 95° C. for about 20 to about 70 seconds.

Optionally (especially for monocrystalline substrates), the substrate can also be texturized by, for example, anisotropic etching of the crystallographic planes. Texturing is commonly in the form of pyramid-shapes depressed or projected from the substrate surface. The height or depth of the pyramid-shapes is typically from about 4 to about 7 micrometers. For a typical <100> orientation substrate, a low concentration aqueous NaOH solution at elevated temperature can be used to anisotropically etch the <100> plane revealing the <111> plane in pyramid-shape projections. As used in this application, a "low concentration" solution means, preferably, a concentration of solute less than about 7 wt %. "Elevated temperature" as used herein means, preferably, a temperature greater than about 80° C. Under such conditions, for example, a substrate would be placed in the solution for about 10 to about 30 minutes.

An emitter layer is formed typically by doping the substrate with an n-type dopant. N-doping can be accomplished by depositing the n-dopant onto the substrate and then heating the substrate to "drive" the n-dopant into the substrate. Gaseous diffusion can be used to deposit the n-dopant onto the substrate surface. However, other methods can also be used, such as ion implantation, solid state diffusion, or other methods used in the art to create an n-doped layer and a shallow p-n junction proximal to the substrate surface. Phosphorus is a preferred n-dopant, but any suitable n-dopant can be used alone or in combination, such as arsenic, antimony or lithium. Typically, a plurality of substrates are placed in a tray such that the front and back surfaces and the edges of the substrate are exposed to the n-dopant. Using this method, an emitter layer and p-n junction created in the n-doping process are formed along all of the surfaces of the substrate.

The depth of the n-doped layer at the front surface is typically greater than about 0.1 micrometer, preferably greater than about 0.2 micrometers and is typically less than about 0.5 micrometers, preferably less than about 0.3 micrometers. The surface dopant concentration of the emitter layer at the front surface is preferably greater than about $10^{18}$ atoms/cm$^3$, more preferably greater than about $10^{19}$ atoms/cm$^3$. The surface dopant concentration of the emitter layer at the front surface can be as high as saturation, but is typically less than about $10^{22}$ atoms/cm$^3$, more preferably less than about $10^{21}$ atoms/cm$^3$, most preferably the surface dopant concentration of the emitter layer is about $10^{20}$ atoms/cm$^3$. The n-doping process typically creates a layer of silicon oxide on the surfaces of the wafer. The silicon oxide can function as an antireflective coating and as a surface passivator; However, the silicon oxide layer can be advantageously removed in favor of a coating such as silicon nitride and back surface etching. The silicon oxide can be removed through, for example, chemical etching in a wet chemical bath, typically a low concentration HF solution at ambient temperature for about 10 to about 40 seconds.

A surface coating or film is applied to the substrate. The surface coating is applied after the creation of the emitter layer and is disposed over the emitter layer at the front surface and preferably the edge surface, and more preferably over the edge surface and the periphery of the back surface. The surface coating masks the front surface, preferably the edges, and more preferably the edges and the periphery of the back surface, during back surface etching and preferably serves one or more of the following functions: anti-reflective coating, surface passivation, and bulk passivation. Silicon nitride is preferred as a surface coating because it can function as a mask, an antireflective coating, provide surface passivation and provide bulk passivation. Preferably, hydrogen is trapped in such a silicon nitride surface coating. However, the surface coating can be any coating, film or combinations of coatings or films which can function as a mask and preferably serves one or more of the above functions. Other possible substances that can be used as a surface coating include tantalum oxide, silicon dioxide, and titanium oxide. Combination of any such coatings, films and dielectrics can also be used as a surface coating.

The surface coating is typically applied using plasma enhanced chemical vapor deposition or other techniques known in the art, such as atmospheric chemical vapor deposition (APCVD), thermal oxidation, screen printing of pastes, inks or sol gel, etc. The surface coating is applied so that it is disposed over the front surface and preferably the edges of the substrate preferably by placing the back surface of the substrate against a plate. This may be accomplished by placing a plurality of substrates horizontally on a tray or plate. Substrates can also be placed vertically or at an angle such that the back surface is against a flat surface; for example, a graphite plate. The back surface of the substrate remains free or substantially free of the surface coating. By "substantially free of the surface coating" is meant that surface coating disposed over the back surface is limited to the periphery of the back surface; for example, less than about 5 mm from an edge of the substrate. The surface coating disposed over the front surface of the substrate is preferably silicon nitride and is preferably greater than about 65 nanometers, more preferably greater than about 70 nanometers, most preferably, greater than about 72 nanometers; and preferably less than about 120 nanometers, more preferably less than 100 nanometers, most preferably less than about 77 nanometers thick.

After the surface coating is applied, the substrate is subjected to back surface etching to remove the p-n junction and, if present, texturing from the uncoated portion back surface. The surface coating acts as a mask for the front surface, preferably also the edges, more preferably the edges and the back surface periphery, and therefore limits the etching to the uncoated portion of the substrate. Back surface etching is generally accomplished by placing the substrate in a chemical bath to remove the n-doped region from the back surface. The type of chemical used, the temperature of the bath and the time the substrate is kept in the bath are dependant upon the material used for the substrate. For example, a 30 wt % aqueous NaOH bath at a temperature in the range of from about 80° C. to about 92° C. can be used for either monocrystalline or multicrystalline silicon. A monocrystalline silicon substrate would be exposed, for example, to the bath for about 80 seconds to about 100 seconds. A multicrystalline silicon substrate would generally be exposed to the bath for a longer period of time, for example, at least about 3 minutes and up to, for example, about 6 minutes. Any etch, and preferably a chemical etch, capable of removing the n-doped region of the back surface can be used at a temperature and for a time period that effects removal of the n-doped region of the back surface without substantial degradation of the surface coating. By "without substantial degradation" is meant that the surface coating remains disposed over the front face, preferably also the edges, and, preferably, the back periphery of the substrate.

After the etch to remove the p-n junction from the back surface, the substrate can be cleaned with another chemical etch for example, a 4 wt % solution of HF, prior to rinsing and drying the wafer. Back surface etching results in an untextured or substantially smooth back surface. As used herein, "substantially smooth" back surface preferably means that the back surface is untextured except for the portion of the back surface, if any, over which a surface coating is disposed. "Untextured" as used herein, preferably means the absence of peaks or valleys on the substrate surface; for example, the absence of anisotropic etch surface topography or, as further example, having a surface topography consistent with isotropic etching. Back surface etching also results in a back surface which is free or substantially free of n-dopant and free or substantially free of a p-n junction. As used herein, "substantially free of n-dopant" preferably means that the n-dopant has been etched from the back surface except that n-dopant may still be present at the portion of the back surface over which a surface coating is disposed. After etching, some n-dopant can be present in the unmasked region of the back surface at a substantially reduced surface concentration; for example, a surface concentration less than about $10^{15}$ atoms/$cm^3$, preferably less than about $10^{13}$ atoms/$cm^3$, more preferably less than about $10^{11}$ atoms/$cm^3$. As used herein, "substantially free of a p-n junction proximal to the back surface" means that the p-n junction proximal to the portion of the back surface over which the surface coating is not disposed is removed or rendered ineffective due to a decreased concentration of n-dopant, for example, a back surface concentration of n-dopant less than about $10^{15}$ atoms/$cm^3$, preferably less than about $10^{13}$ atoms/$cm^3$, more preferably less than about $10^{11}$ atoms/$cm^3$, where the "atoms" are the atoms of dopant.

Front and back contacts are then applied to the substrate. Typically, contacts are in the form of a conductive metal placed on or into the front and back surfaces. The contacts can be created using photolithographic methods, by laser grooving and electroless plating methods, screen printing, or any other method that provides good ohmic contact with the front and back surfaces respectively such that electric current can be drawn from the photovoltaic cell. Typically, the contacts are present in a design or pattern, for example a grid, fingers, lines, etc., and do not cover the entire front or back surface. The contacts are preferably screen printed onto the substrate using a conductive metal paste; for example, a silver paste. The contacts are typically screen printed onto one surface, allowed to dry and then printed on the opposite surface. After applying the contacts, the substrate is fired, typically at a temperature of from about 800 to about 950° C., to anneal the contacts to the substrate. Methods for adding contacts to a wafer substrate for a photovoltaic cell are known in the art. See, for example, U.S. Pat. Nos. 4,726,850 and 4,748,130 which are incorporated by reference herein, and which disclose methods for forming buried contacts.

Preferably, the process of this invention includes the formation of a back surface field to increase the efficiency of the photovoltaic cell. A back surface field is preferably formed contemporaneously with the forming of the back contacts. However, it can be formed either before or after forming the back contacts. A back surface field can be generated by forming a p+ layer on at least a portion of the back surface of the substrate. A p+ layer is a layer heavily doped with a p-type substance. By "heavily doped" we mean, preferably, that the doping is substantially greater doping than the p-doping of the substrate. The depth of the layer is typically equal to or less than the depth of the emitter layer and preferably less than about 0.5 micrometers, more preferably less than about 0.3 micrometers; and is preferably greater than about 0.1 micrometers, more preferably greater than about 0.2 micrometers in depth. The peak doping concentration of the p+ layer is advantageously greater than about $10^{17}$ atoms/$cm^3$, preferably greater than about $10^{18}$ atoms/$cm^3$. The p+ doping concentration can be as great as the saturation point; However, it is preferably less than about $10^{20}$ atoms/$cm^3$, more preferably less than about $10^{19}$ atoms/$cm^3$, where the "atoms" are atoms of dopant.

The p+ layer is advantageously formed by alloying a substance into the back surface of the substrate. Aluminum is typically used but any substance can be used which is capable of alloying with the substrate and resulting in a p+ layer. Aluminum, or other alloying substance such as, for example, boron, gallium or indium, is deposited onto the back surface of the substrate. The aluminum or other alloying substance is preferably applied using screen printing techniques. Methods for screen printing materials such as pastes are, as stated above, known in the art. The substrate is then fired at a temperature sufficient to alloy the aluminum or other substance, as mentioned above, used to form a p+ layer to the silicon wafer substrate, preferably at a temperature of about 800 to about 950° C., thereby creating a back surface field. In one embodiment of this invention, the front and rear contacts are screen printed onto the substrate and dried followed by screen printing of aluminum onto the back surface of the substrate. Preferably, the aluminum is limited to portions of the back surface not covered by the back contact. The contacts and the aluminum can then be fired in one firing step.

Optionally, the portion of the n-doped layer at the periphery of the back surface may be removed after doping and before application of the surface coating. Such removal can be accomplished by using an etchant, laser scribing, mechanical scribing, or other known removal methods. For example, a commercial isotropic silicon etchant paste can be used to remove the n-doped layer at the periphery of the back surface of a silicon substrate by applying the etchant onto the periphery of the back surface, heating the substrate to elevated temperature, and then washing the substrate with, for example, de-ionized water. The particular temperature and the period of time that the substrate is heated will depend upon the particular etchant used. This optional step could be included if formation of the surface coating disposed over the back surface periphery is unpredictable, non-uniform, or both, to such an extent that unacceptable number of the photovoltaic cells fail to function properly. For example, this optional step could be added if, in an automated manufacturing process, variation in the surface coating disposed over the back surface periphery is greater than the tolerances of downstream equipment.

One benefit of this process and of the resulting photovoltaic cell arises from eliminating the edge junction isolation step. This process results in fewer cells being damaged in the edge junction isolation step and also permits use of a thinner silicon wafer than that which can be effectively used in processes employing a "coin stacking" step. The method of this invention avoids the decrease in surface area of the front surface that results from an edge junction isolation step. Thus, the preferred photovoltaic cells of this invention do not have an edge that was treated to remove the p-n junction. The photovoltaic cells of this invention can have a front surface area at least about 2 percent greater than photovoltaic cells made using the same initial substrate size and employing an edge junction isolation step. Thus, the photovoltaic cells of this invention can have a p-n front surface area that is (prior to the addition of the front contact) at least about 95 percent of the total area of the front surface of the substrate used to make the cell, preferably at least about 98 percent, more preferably at least about 99 percent and most preferably about 100 percent of the total area of the front surface of the substrate used to make the cell. As used herein "p-n front surface area" means the area of the front surface of the cell prior to adding the front contacts that has a proximal p-n junction. The process of this invention also eliminates the need for plasma etching apparatus typically used for edge junction isolation in accordance with the coin stacking method.

The method of this invention also avoids the additional processing steps involved in using lasers to isolate the front p-n junction. Further process improvements are achieved by using silicon nitride as a surface coating to serve as both an antireflective coating and a mask for etching of the back surface.

Another benefit of the photovoltaic cells of this invention is that the back surface of the cell is free or substantially free of any n-dopant. Prior art cells utilizing back surface fields alloy a compound, typically aluminum, through an n-doped layer on the back surface and into the silicon substrate. The n-dopant compound is not removed, therefore the efficacy of the resulting back surface field is reduced compared to a cell utilizing the same alloying process but having a back surface which is free or substantially free of n-dopant. Removal of the back n-doped layer increases the effectiveness of the back surface field and increases the efficiency of the resulting photovoltaic cell.

A further benefit of the photovoltaic cells of this invention is that the back surface is preferably substantially smooth as opposed to textured. The efficiency of photovoltaic cells is improved by front surface texturing; However, texturing typically occurs on both the front and back surfaces of a substrate. It is well known that a substantially smooth, untextured back surface results in better back surface passivation. The process of this invention removes texturing on the back surface and provides the advantageous substantially smooth or untextured back surface qualities.

FIG. 1 shows a cross-section of a cell 10 in accordance of an embodiment of this invention. The photovoltaic cell 10 comprises a textured, boron-doped substrate 20. The texture is symbolically depicted as 26. A textured, n-doped layer 30, formed by phosphorus diffusion, is present on the front surface 22, the edges 23, and the periphery 28 of the substantially smooth back surface 24. A p-n junction 32 is present where the boron doped substrate 20 meets the n-doped layer 30. A surface coating 40 is disposed over the n-doped layer 30 of the cell on the edges 23, the front surface 22, and the periphery 28 of the back surface 24. The surface coating 40 masked the edges, the periphery 28 of the back surface 24, and the front surface 22 of the cell 10 during back surface etching. Back surface etching removed the texture and the phosphorus from the back surface 24. A p+ layer 34 was formed on the back surface 24 by alloying aluminum to the back surface 24. The p+ layer 34 creates a back surface field. Contacts (not shown) would be placed on the front surface 22 and the back surface 24 to draw a current from the cell when it is exposed to sunlight or other light source.

Without limiting the scope of this invention, the advantageous efficiency of an embodiment of the photovoltaic cells of this invention is demonstrated by the following example.

EXAMPLE

Photovoltaic cells were made according to the process of this invention using monocrystalline boron-doped pseudo-square silicon substrates having a diameter of 150 mm and straight side width of 125 mm. The substrate thickness was 300 micrometers. The p-n junction was created by phosphorous diffusion after texturing of the substrate. The substrate was coated with silicon nitride in accordance with the process of this invention such that the thickness of the silicon nitride coating on the front surface was about 74 to 75 nanometers. Texture and phosphorous doping were removed from substantially all of the back surface by back surface etching in a 30 wt % aqueous NaOH bath for about 90 seconds at a temperature in the range of 81 to 91° C. Front and back contacts were applied by screen printing method using a silver paste. Aluminum was then screen printed onto the portion of the back surface free of silver and free of silicon nitride. The cells were then fired at a temperature of about 895° C. These cells are referred to as non-phosphorous planar back surface field cells (NPPBSF). 128 NPPBSF cells were produced.

Comparative photovoltaic cells were also produced ("base line" cells) using monocrystalline boron-doped pseudo-square silicon substrates having a diameter of 150 mm and straight side width of 125 mm. The substrate thickness was 300 micrometers. The base line cells were textured and phosphorous doped in a manner and under conditions identical to the NPPBSF cells. The edge junctions of the base line cells were then removed by plasma etch using the coin stacking method. The base line cells were then coated with silicon nitride such that the thickness of the silicon nitride coating on the front surface was 74 to 75 nanometers thick. Front and back contacts were applied using the same pattern as the NPPBSF cells by screen printing method using a silver paste. Aluminum was then screen printed onto the portion of the back surface free of silver and free of silicon nitride. The cells were then fired at a temperature of about 895° C. 279 base line cells were produced.

The efficiency of NPPBSF cells and the base line cells was measured using a 100 mW/cm$^2$ tungsten light source calibrated with standard cell data measured with AM1.5 spectrum and 100 mW/cm$^2$ at 25° C. The cells were then sorted according to the measured efficiency. The results are shown in Table 1.

These results show that photovoltaic cells of this invention and made in accordance with the process of this invention are superior in efficiency in converting light energy into electrical energy.

TABLE 1

Efficiency Distribution of NPPBSF Cells Compared to Base Line Cells

| Efficiency Range | Base Line Cells | NPPBSF Cells |
|---|---|---|
| Below 14.5 | 0.36% | 2.34% |
| 14.5-15.0 | 1.79% | 2.34% |
| 15.0-15.5 | 36.20% | 3.13% |
| 15.5-16.0 | 61.65% | 40.63% |
| 16.0-16.5 | 0.00% | 51.56% |

That which is claimed is:

1. A process for making a photovoltaic device using a substrate comprising silicon doped with a first dopant, the process comprising the steps of:
   (a) forming a first layer of the substrate at a front surface and at least on edge surface, the first layer comprising a second dopant of a conductivity type opposite the first dopant;
   (b) disposing over the first layer a surface coating such that a back surface of the substrate is free or substantially free of the surface coating; and
   (c) removing the second dopant from the back surface such that the back surface is free or substantially free of the second dopant.

2. The process according to claim 1 further comprising the step of texturing the substrate.

3. The process according to claim 2 further comprising the step of removing the texture from the back surface such that the back surface is substantially smooth.

4. The process according to claim 3 further comprising the step of forming a back surface field.

5. The process according to claim 1 wherein the surface coating comprises silicon nitride.

6. The process of claim 1 wherein the surface coating is formed such that only a back surface of the substrate is free or substantially free of the surface coating.

7. The process of claim 1 wherein, in the step of disposing over the first layer a surface coating such that a back surface of the substrate is free or substantially free of the surface coating, the surface coating is also formed on the periphery of the back surface.

* * * * *

UNITED STATES PATENT AND TRADEMARK OFFICE
CERTIFICATE OF CORRECTION

PATENT NO.         : 7,402,448 B2                                    Page 1 of 1
APPLICATION NO. : 10/767625
DATED              : July 22, 2008
INVENTOR(S)        : Srinivasamohan Narayanan and Bikash Kumar It is certified that error appears in the above-identified patent and that said Letters Patent is hereby corrected as shown below:

On the title page item (73) Assignee – Add:

TATA BP Solar India Limited
Worli Mumbai, India

Signed and Sealed this

Seventeenth Day of February, 2009

JOHN DOLL
*Acting Director of the United States Patent and Trademark Office*